United States Patent
Kwon

(10) Patent No.: US 10,324,128 B2
(45) Date of Patent: Jun. 18, 2019

(54) METHOD OF TESTING SEMICONDUCTOR DEVICES AND SYSTEM FOR TESTING SEMICONDUCTOR DEVICES

(71) Applicant: SAMSUNG ELECTRONICS CO., LTD., Suwon-si, Gyeonggi-Do (KR)

(72) Inventor: Oh Song Kwon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 188 days.

(21) Appl. No.: 15/615,850

(22) Filed: Jun. 7, 2017

(65) Prior Publication Data

US 2018/0188311 A1 Jul. 5, 2018

(30) Foreign Application Priority Data

Dec. 30, 2016 (KR) .................. 10-2016-0184157

(51) Int. Cl.
*G01R 31/30* (2006.01)

(52) U.S. Cl.
CPC ..... *G01R 31/3016* (2013.01); *G01R 31/3004* (2013.01)

(58) Field of Classification Search
CPC ............ G01R 31/2601; G01R 31/3183; G01R 31/319; G01R 31/2612
See application file for complete search history.

(56) References Cited

U.S. PATENT DOCUMENTS

| 5,648,766 | A | * | 7/1997 | Stengel | G05F 1/46 331/57 |
|---|---|---|---|---|---|
| 7,739,531 | B1 | * | 6/2010 | Krishnan | G06F 1/3203 713/322 |
| 8,008,967 | B2 | | 8/2011 | Okano et al. | |
| 8,339,190 | B2 | | 12/2012 | Otsuga et al. | |
| 8,368,457 | B2 | | 2/2013 | Ikenaga | |
| 8,472,278 | B2 | | 6/2013 | Haass et al. | |
| 8,762,087 | B2 | | 6/2014 | Joshi et al. | |
| 9,159,378 | B2 | | 10/2015 | Winter et al. | |
| 2006/0274473 | A1 | * | 12/2006 | Reddy | G01R 31/002 361/118 |

(Continued)

FOREIGN PATENT DOCUMENTS

JP 2015-097057 A 5/2015

*Primary Examiner* — Tung X Nguyen
*Assistant Examiner* — Dominic E Hawkins
(74) *Attorney, Agent, or Firm* — Volentine, Whitt & Francos, PLLC

(57) ABSTRACT

Provided are a method of testing semiconductor device and a system for testing semiconductor device. The method includes measuring a minimum operating voltage of each of a plurality of sample semiconductor devices and an operating frequency of corresponding ring oscillators included in each of the plurality of sample semiconductor devices, generating a model between the operating frequencies of the ring oscillators and the minimum operating voltages of the sample semiconductor devices, measuring an operating frequency of ring oscillators included in a target semiconductor device, and determining a target minimum operating voltage of the target semiconductor device based on the operating frequency of the ring oscillators of the target semiconductor device and the model.

20 Claims, 13 Drawing Sheets

(56) References Cited

U.S. PATENT DOCUMENTS

| | | | |
|---|---|---|---|
| 2008/0100328 A1* | 5/2008 | Dhong | G01R 31/3004 324/750.3 |
| 2010/0164476 A1* | 7/2010 | Molchanov | G01R 31/31725 324/76.82 |
| 2011/0068855 A1* | 3/2011 | Ikenaga | G06F 1/3203 327/535 |
| 2012/0072881 A1 | 3/2012 | Kobayashi | |
| 2012/0330616 A1* | 12/2012 | Berry | G01R 31/2879 702/186 |
| 2013/0013247 A1* | 1/2013 | Sato | G01R 31/288 702/117 |
| 2013/0335152 A1* | 12/2013 | Burnette | H03K 3/0315 331/57 |
| 2014/0225624 A1* | 8/2014 | Chakrabarty | G01R 31/318558 324/509 |
| 2016/0225421 A1 | 8/2016 | Arita et al. | |
| 2016/0239401 A1 | 8/2016 | Li | |
| 2017/0059644 A1* | 3/2017 | Linder | G01R 31/2621 |

* cited by examiner

METHOD OF TESTING SEMICONDUCTOR DEVICES AND SYSTEM FOR TESTING SEMICONDUCTOR DEVICES

This U.S. non-provisional patent application claims priority under 35 U.S.C. 119 to Korean Patent Application No. 10-2016-0184157, filed on Dec. 30, 2016 in the Korean Intellectual Property Office, the contents of which are incorporated herein by reference in their entirety.

BACKGROUND

1. Field of the Disclosure

The present disclosure relates to a method of testing a semiconductor device and a system for testing a semiconductor device. More specifically, the present disclosure relates to a method of testing a semiconductor device using a model generated between the minimum operating voltages of semiconductor chips and the operating frequencies of corresponding ring oscillators included in the semiconductor chips, and a system for testing a semiconductor device using the method.

2. Description of the Related Art

After semiconductor devices have been fabricated, the semiconductor devices undergo various tests in order to ensure operational reliability. A number of operating parameters are set based on results of such tests. The type and number of such tests tends to increase to cope with various environmental variables that are expected in the operation of semiconductor devices. Therefore, in testing a semiconductor device, it is essential to increase test speed and throughput by using an efficient test method.

The above-mentioned operating parameters may have certain correlations among them. By utilizing such correlations, it may be possible to predict the tendency of an operating parameter by measuring another operating parameter. This may be used to improve the test speed and throughput of semiconductor devices.

SUMMARY

Aspects of the present disclosure provide a method of testing a semiconductor device by using correlations between a plurality of ring oscillators formed in semiconductor devices and the minimum operating voltages of the semiconductor devices to thereby predict the minimum operating voltage of a target semiconductor device.

Aspects of the present disclosure also provide a system for testing a semiconductor device by using correlations between multiple ring oscillators formed in semiconductor devices and the minimum operating voltages of the semiconductor devices to thereby predict the minimum operating voltage of a target semiconductor device.

In accordance with an aspect of the present disclosure, a method of testing a semiconductor device includes measuring minimum operating voltages of each of multiple sample semiconductor devices and operating frequencies of corresponding ring oscillators included in each of the sample semiconductor devices, generating a model between the operating frequencies of the ring oscillators and the minimum operating voltages of the corresponding sample semiconductor devices, measuring an operating frequency of ring oscillators included in a target semiconductor device, and determining a target minimum operating voltage of the target semiconductor device based on the operating frequency of the ring oscillators of the target semiconductor device and the model.

In accordance with another aspect of the present disclosure, a system for testing a semiconductor device includes a measuring unit configured to measure minimum operating voltages of each of multiple sample semiconductor devices and operating frequencies of corresponding ring oscillators included in each of the sample semiconductor devices, a model generation unit configured to generate a model between the operating frequencies of the ring oscillators and the minimum operating voltages of each of the corresponding sample semiconductor devices, and a calculation unit (e.g., calculator) configured to determine a target minimum operating voltage of a target semiconductor device from the model by using an operating voltage of a target semiconductor device provided from the measuring unit and the operating frequency of the ring oscillators included in the target semiconductor device.

This and other aspects, embodiments and advantages of the present disclosure will become immediately apparent to those of ordinary skill in the art upon review of the Detailed Description and Claims to follow.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, a method of testing a semiconductor device according to an exemplary embodiment of the present disclosure and a test system for performing the method will be described with reference to FIGS. 1 to 10.

Figure 1:
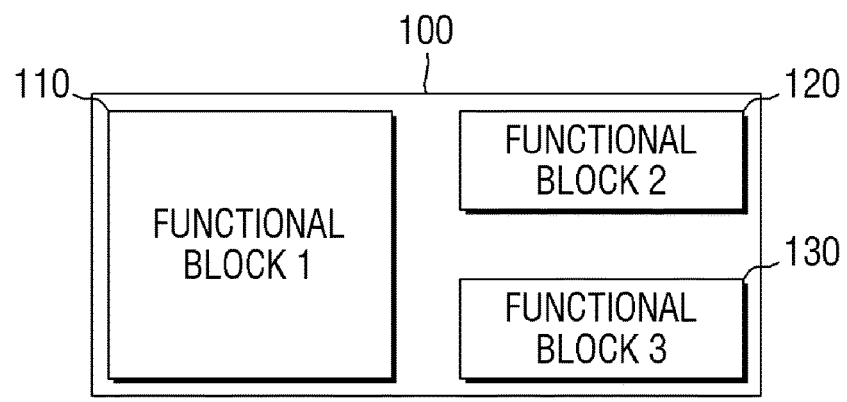
FIG. 1 is a block diagram illustrating a semiconductor chip to which a method of testing a semiconductor device according to some embodiments of the present disclosure may be applied.

FIG. 1 is a block diagram illustrating a semiconductor chip to which a method of testing a semiconductor device according to some embodiments of the present disclosure may be applied.

Referring to FIG. 1, a method of testing a semiconductor device according to some embodiments of the present disclosure may be performed on a semiconductor device 100.

The semiconductor device 100 may be, for example, a memory chip or a logic chip. When the semiconductor device 100 is a memory chip or a logic chip, the semiconductor device 100 may be designed in various ways depending on, for example, the operations to be performed.

When the semiconductor device 100 is a memory chip, the memory chip may be, for example, a non-volatile memory chip. Specifically, the memory chip may be a flash memory chip, and more specifically, the memory chip may be either a NAND flash memory chip or a NOR flash memory chip.

It is to be noted that the type of the memory chip to which the method according to the technical idea of the present disclosure can be applied is not limited thereto. In some embodiments of the present disclosure, the memory chip may be a volatile memory chip. Specifically, the memory chip may be, but is not limited to, a dynamic random access memory (DRAM), a static random access memory (SRAM), and/or an embedded RAM.

When the semiconductor device 100 is a logic chip, the logic chip may include, but is not limited to, a central processing unit (CPU), a graphics processing unit (GPU), an application processor (AP), and/or a field programmable grid array (FPGA).

In the following description of the method of testing a semiconductor device, it is assumed that the semiconductor device 100 is an application processor.

The semiconductor device 100 may include multiple functional blocks 110, 120 and 130. Although the semiconductor device 100 includes three functional blocks 110, 120 and 130 in FIG. 1, the technical idea of the present disclosure is not limited thereto. The semiconductor device 100 may include more or fewer functional blocks depending on design choice.

In the above example where the semiconductor device 100 is an application processor, the first functional block 110 may be a (relatively) big core, the second functional block 120 may be a (relatively) little core, and the third functional block 130 may be a GPU, for example. However, this is merely illustrative.

Figure 2A:
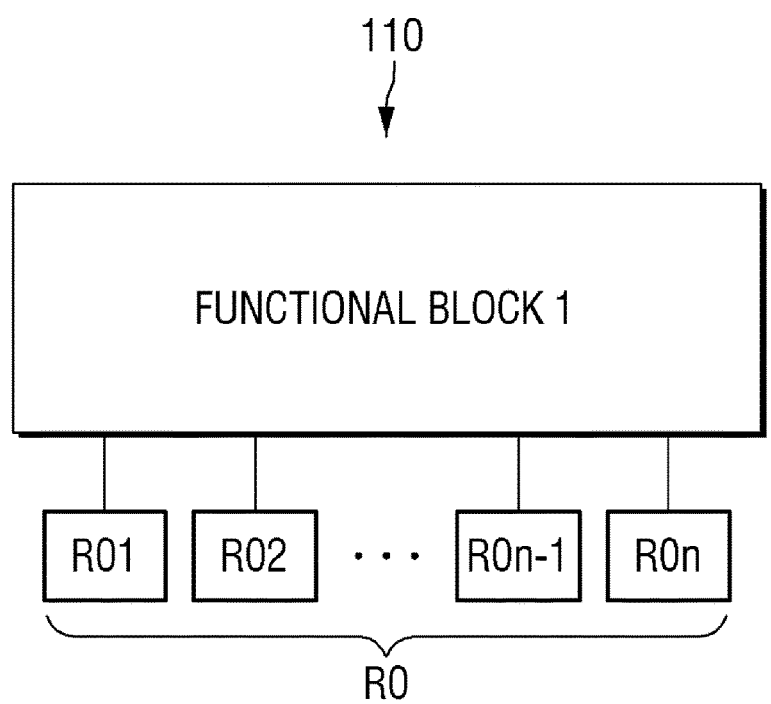
FIG. 2A is a block diagram illustrating a part of a semiconductor chip to which a method of testing a semiconductor device according to some embodiments of the present disclosure can be applied.

FIG. 2A is a block diagram illustrating a part of a semiconductor chip to which a method of testing a semiconductor device according to some embodiments of the present disclosure can be applied.

Referring to FIG. 2A, the first functional block 110 is shown in more detail. The first functional block 110 may include multiple ring oscillators ROs in addition to circuit elements constituting the first functional block 110. In FIG. 2A, the first functional block 110 includes the first to $n^{th}$ ring oscillators $RO_1, RO_2, \ldots RO_{n-1}, RO_n$. Ring oscillators are described in more detail below relative to FIG. 2B.

In FIG. 2A, the first functional block 110 includes the ring oscillators ROs. It is, however, apparent to those skilled in the art that each of the second functional block 120 and the third functional block 130 also includes multiple ring oscillators.

That is, in the semiconductor device 100, each of the first to third functional blocks 110, 120 and 130 may include the ring oscillators ROs. In the semiconductor device 100, the operational characteristics of such ring oscillators ROs may have a certain relationship with the minimum operating voltage (Low VCC or LVCC) of the semiconductor device 100, as will be described later in more detail. In the method of testing a semiconductor device according to some exemplary embodiments of the present disclosure, characteristics of a target semiconductor device can be predicted by using the relationship between the operating characteristics of the ring oscillators ROs and the minimum operating voltage of the semiconductor device 100. A more detailed description thereon will be made below.

Figure 2B:
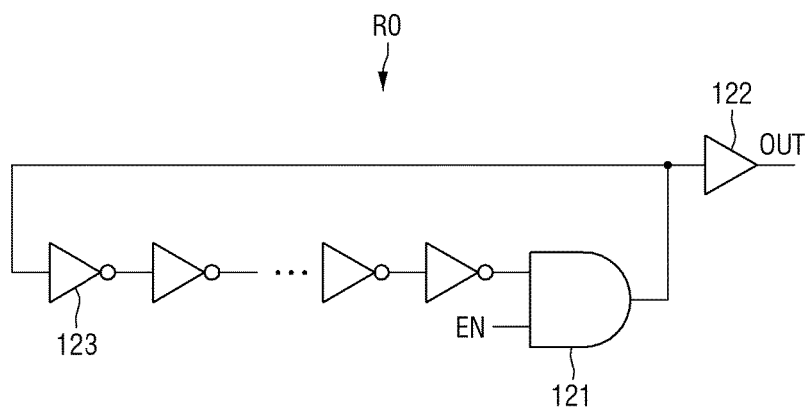
FIG. 2B is a circuit diagram illustrating a part of a semiconductor chip to which a method of testing a semiconductor device according to some embodiments can be applied.

FIG. 2B is a circuit diagram illustrating a part of a semiconductor chip to which a method of testing a semiconductor device according to some embodiments of the present disclosure can be applied.

Referring to FIG. 2B, each of the ring oscillators ROs may include multiple NOT gates (or inverters) 123 connected in series, an AND gate 121 connected to the output of the ring oscillators ROs, and a buffer 122.

Each of the ring oscillators ROs may include an odd number of NOT gates 123. The odd number of NOT gates 123 are connected in a ring structure in which the output of one NOT gate 123 is connected to the input of another NOT gate 123. The output voltage OUT of each of the ring oscillators RO is outputted via the buffer 122 and oscillates between two voltage levels, TRUE and FALSE. The AND gate 121 receives an enable signal EN and provides an output to the buffer 122 and the NOT gates 123.

In general, the semiconductor device 100 to which a method of testing a semiconductor device according to some embodiments of the present disclosure is applied may include numerous transistors. The operating characteristics of such transistors may include, for example, a threshold voltage VT of a transistor, or a response speed of a transistor.

Among these, the ring oscillators ROs can exhibit the response speed characteristics of the semiconductor device 100. Specifically, the response speed characteristics of the transistors included in the semiconductor device 100 may be determined depending on how many times the output OUT from the ring oscillators ROs has oscillated for a given time period in response to an input.

The first functional block 110 of the semiconductor device 100 includes multiple ring oscillators ROs therein, and the response speed of the oscillators RO can be measured by applying an input signal to the ring oscillators ROs during the fabricating process of the semiconductor device 100. In the following description of exemplary embodiments, the minimum operating voltage of the first functional block 110 of the semiconductor device 100 and the response speed of the ring oscillators ROs included in the first functional block 110 are measured.

Figure 3:
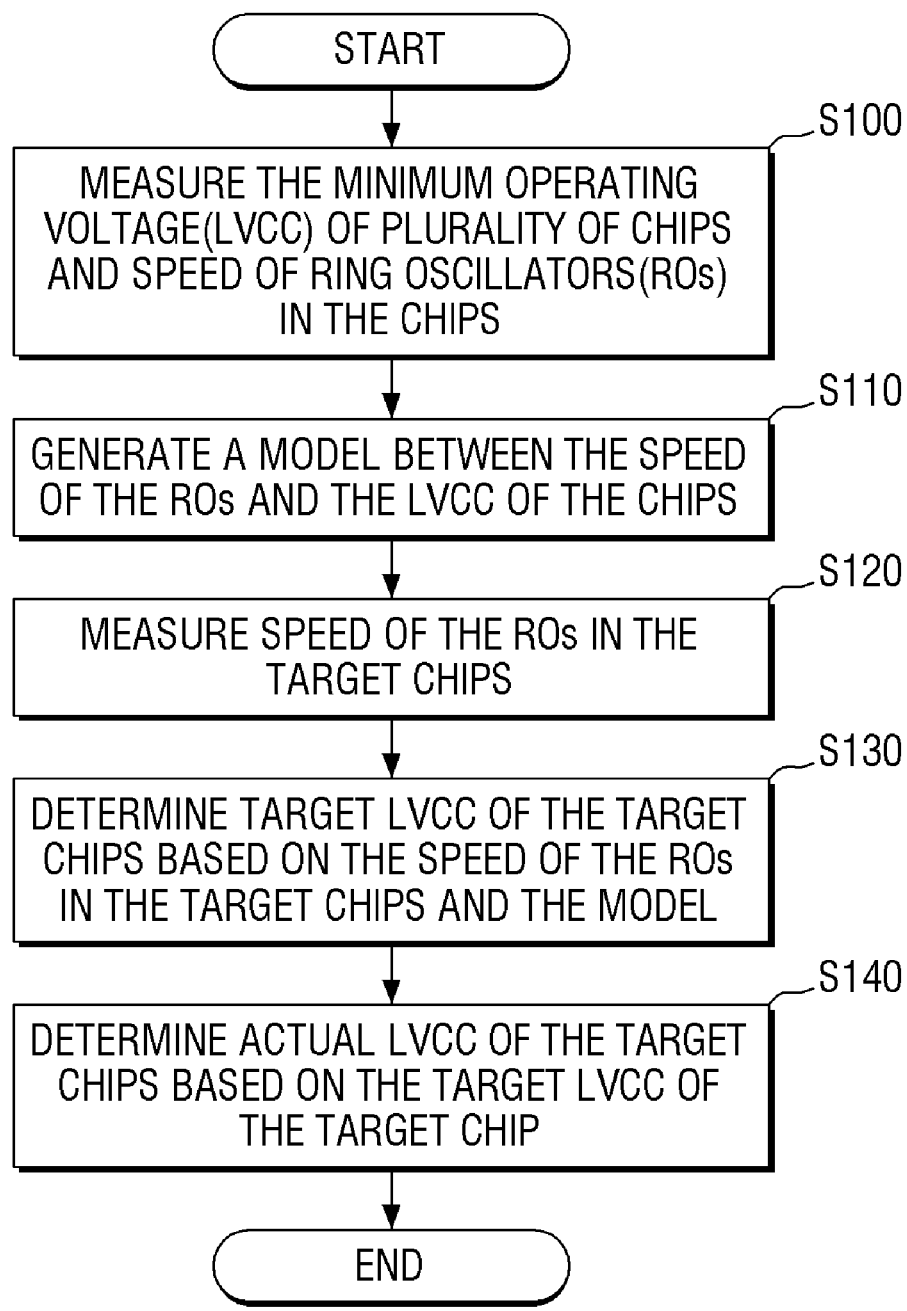
FIG. 3 is a flowchart illustrating a method of testing a semiconductor device according to an exemplary embodiment of the present disclosure.

FIG. 3 is a flowchart illustrating a method of testing a semiconductor device according to an exemplary embodiment of the present disclosure.

Referring to FIG. 3, a method of testing a semiconductor device according to an exemplary embodiment of the present disclosure includes measuring the minimum operating voltage LVCC of multiple semiconductor chips and the operating frequency of corresponding ring oscillators ROs included in each of the semiconductor chips (S100). A model is generated to show the relationship, pattern, and/or correspondence between the measured operating frequencies of the ring oscillators ROs and the minimum operating voltages of each of the corresponding semiconductor device (S110). The operating frequency of the ring oscillators ROs included in a target semiconductor device is measured (S120). The target minimum operating voltage of the target semiconductor device is determined based on the operating frequency of the ring oscillators of the target semiconductor device and the model (S130). The actual operating voltage of the transmit semiconductor device is determined based on the target minimum operating voltage (S140).

Initially, the minimum operating voltage (LVCC) of multiple sample semiconductor devices (or chips) and the operating frequency of corresponding ring oscillators included in each of the sample semiconductor devices are measured (S100). This will be described in more detail with reference to FIG. 4.

Figure 4:
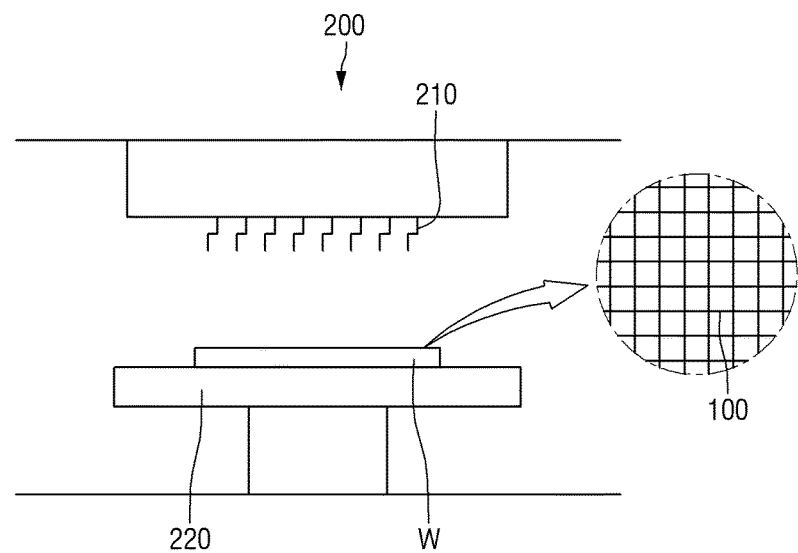
FIG. 4 is a diagram illustrating a part of processes of a method of testing a semiconductor device according to an exemplary embodiment of the present disclosure.

FIG. 4 is a diagram illustrating a part of processes of a method of testing a semiconductor device according to an exemplary embodiment of the present disclosure.

FIG. 4 schematically shows measuring equipment 200 that measures the minimum operating voltage LVCC and the operating frequency of the ring oscillators ROs of multiple semiconductor devices 100 mounted on a wafer W.

The minimum operating voltage of the semiconductor devices 100 and the operating frequency of the ring oscillators may be measured by loading a wafer W on a stage 220, applying a test signal to the wafer W with probes 210, and receiving an output signal.

In some embodiments of the present disclosure, the measurement may be performed during the fabricating process of the semiconductor devices 100. That is, the measurement may be performed during an electrical die sorting (EDS) process, after the semiconductor devices 100 are formed and before sawing and packaging are performed.

As described above, each of the semiconductor devices 100 may include multiple ring oscillators ROs, and each ring oscillator may include a pad for receiving inputs and outputs. Such a pad may not be exposed after the semiconductor devices 100 are packaged and thus may be accessible externally only before packaging of the semiconductor devices 100. For this reason, the operating frequency of each ring oscillator may be measured during the EDS process.

The minimum operating voltage of a semiconductor device 100 refers to the lowest level of the supply voltage required for normal operation of the semiconductor device 100. To set such minimum operating voltage, it is checked whether a semiconductor device 100 normally operates for several lowest operating voltage levels, and the lowest supply voltage allowing for the normal operation of the semiconductor device 100 is selected as the minimum operating voltage.

As mentioned earlier, a method of testing a semiconductor device according to some embodiments of the present disclosure may identify, calculate, or otherwise determine a certain relationship between the operating frequency of the ring oscillators ROs and the minimum operating voltage. In order to model the relationship, a method of testing a semiconductor device according to some embodiments of the present disclosure includes measuring the minimum operating voltage of each of multiple sample semiconductor chips of the same kind and the operating frequency of ring oscillators included therein, and setting them as the population data for modeling.

In some embodiments of the present disclosure, the minimum operating voltage of the semiconductor devices may be measured for various occasions. That is, the semiconductor devices may operate at different first and second operating frequencies. The first minimum operating voltage for a semiconductor device to operate normally at the first operating frequency may be different from the second minimum operating voltage for a semiconductor device to operate normally at the second operating frequency. In the method of testing a semiconductor device according to and embodiment of the present disclosure, when semiconductor devices to be tested have different operating frequencies, the minimum operating voltage may be measured for each of the operating frequencies.

When the semiconductor devices 100 to be measured are application processors, the semiconductor devices 100 may operate at operating frequencies of, for example, 0.5 to 2 GHz. The minimum operating voltage for the semiconductor devices 100 to operate normally at the operating frequencies within the range may differ from operating frequency to operating frequency. The measuring equipment 200 may measure the minimum operating voltage required by the semiconductor devices 100 for each of several operating frequencies and store the measurements for later modeling.

The minimum operating voltage of the semiconductor devices 100 formed on a single wafer W and the operating frequency of the ring oscillators ROs included therein may be measured by the measuring equipment 200. In some embodiments of the present disclosure, the semiconductor devices 100 to be measured may be formed on the single wafer W. However, the technical idea of the present disclosure is not limited thereto. For example, the semiconductor devices 100 may be formed on multiple wafers W. It is preferable to perform measurement on as many semiconductor devices 100 as possible to increase the accuracy of a created model.

Figure 5:
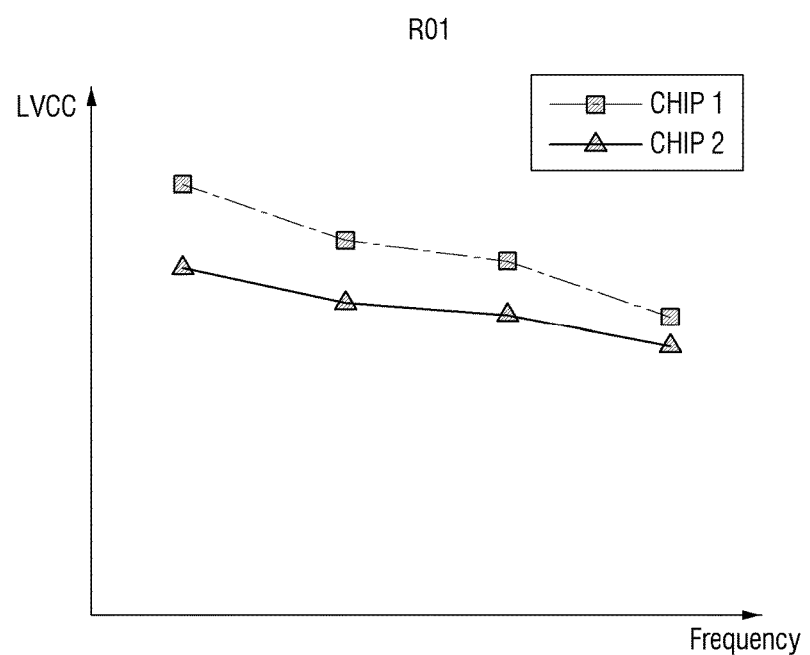
FIG. 5 is a graph illustrating results obtained by performing a method of testing a semiconductor device according to an exemplary embodiment of the present disclosure.

FIG. 5 is a graph illustrating results obtained by performing a method of testing a semiconductor device according to an exemplary embodiment of the present disclosure.

Referring to FIG. 5, the graph shows an example of operating frequencies plotted against voltages. The operating frequencies are of multiple ring oscillators ROs in a first semiconductor device CHIP1 and a second semiconductor device CHIP2 measured by the measuring equipment 200. The voltages are of the first semiconductor device CHIP1 and second semiconductor device CHIP2. In the graph of FIG. 5, the operating frequencies of the first to fourth ring oscillators included in the first semiconductor device CHIP1 may differ from the operating frequencies of the first to fourth ring oscillators included in the second semiconductor device CHIP2. If so, the level of the minimum operating voltage of the first semiconductor device CHIP1 may be different from that of the second semiconductor device CHIP2.

Referring back to FIG. 3, a model is created between the measured minimum operating voltages of the semiconductor devices 100 and the operating frequencies of the corresponding ring oscillators included therein (S110).

In some embodiments of the present disclosure, the model between the minimum operating voltages of the semiconductor devices 100 and the operating frequencies of the corresponding ring oscillators included therein may include a regression model.

Specifically, a regression model may be created in which the measured minimum operating voltage of the semiconductor devices 100 is set as a dependent variable. The operating frequency of the ring oscillators may be set as an independent variable, such that operating frequencies of different ring oscillators have different weights. The regression model is created to show correlation between the operating frequencies and the minimum operating voltage.

The regression model created according to the method of testing a semiconductor device according to some embodiments of the present disclosure may be expressed by Equation 1 below:

$$LVCC = a_1 \times RO_1 + a_2 \times RO_2 + \ldots + a_{n-1} \times RO_{n-1} + a_n \times RO_n + C \quad \text{[Equation 1]}$$

where LVCC denotes the minimum operating voltage of a semiconductor device, and $RO_1$, $RO_2$ ... $RO_{n-1}$ and $RO_n$ denote first to $n^{th}$ ring oscillators included in the semiconductor device, respectively, and C denotes a constant.

In some embodiments of the present disclosure, the regression model may also be expressed by Equation 2 below:

$$LVCC = a_1 \times RO_1 + a_2 \times RO_2 + \ldots + a_{n-1} \times RO_{n-1} + a_n \times RO_n + a_f \times \text{freq} + C \quad \text{[Equation 2]}$$

where freq denotes the operating frequency of the semiconductor device. That is, the relationship between the minimum operating voltage of the semiconductor device and the operating frequencies of the ring oscillators included in the semiconductor devices by Equation 2 may be established taking into account the operating frequency of the semiconductor device.

When the modeling is performed by regression analysis, a least squares method or a maximum likelihood method may be used, for example.

After the testing and modeling for the semiconductor devices have been completed, an additional task may be performed to increase the accuracy of the modeling. Hereinafter, the tasks will be described with reference to FIGS. 6, 7A, 7B and 7C.

Figure 6:
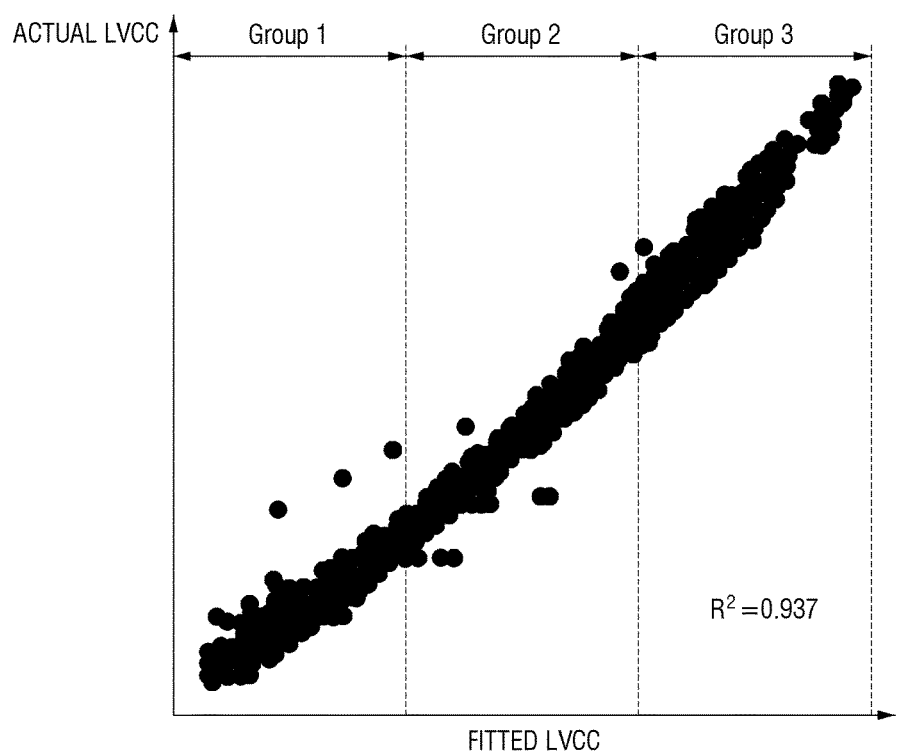
FIG. 6 is a graph illustrating results obtained by performing a method of testing a semiconductor device according to an exemplary embodiment of the present disclosure.
Figure 7A:
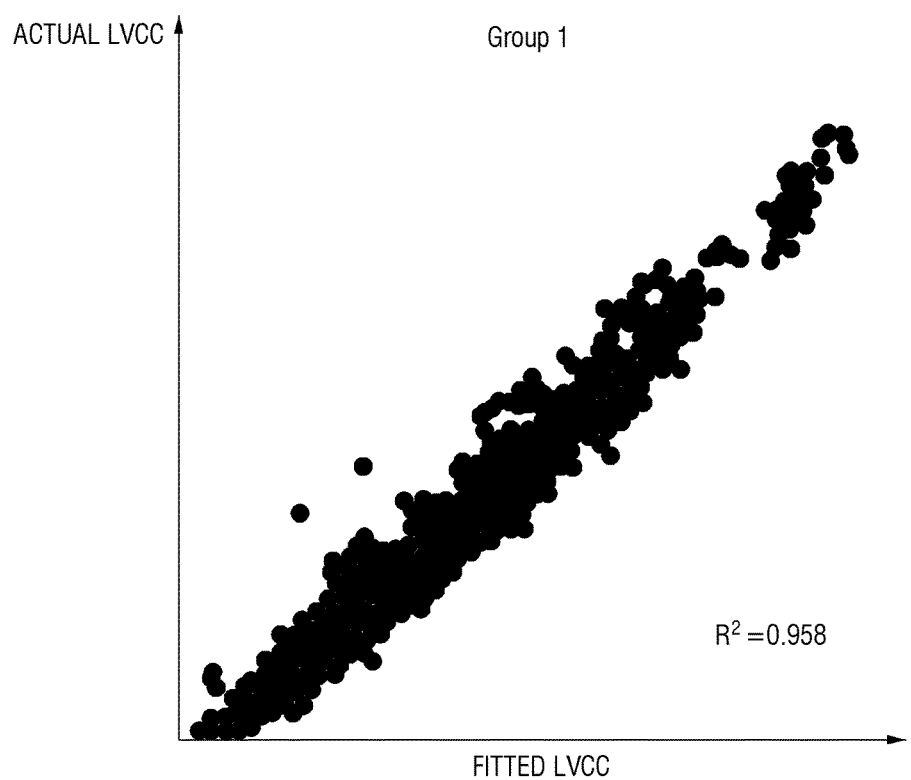
FIGS. 7A to 7C are graphs illustrating divided parts of the graph shown in FIG. 6, respectively.
Figure 7B:
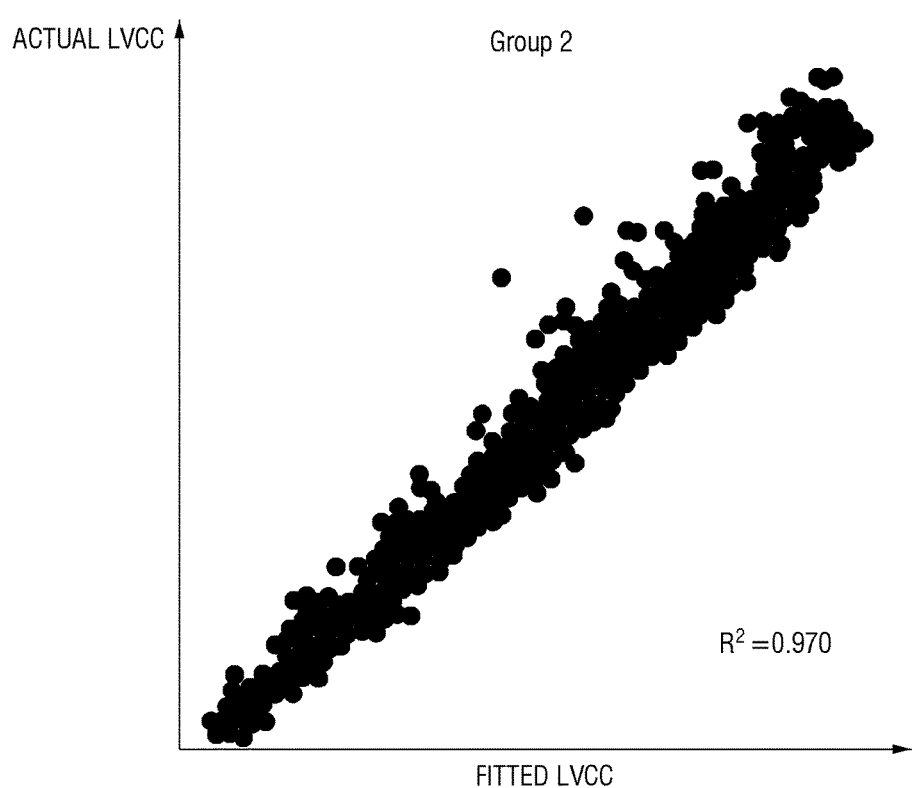
Figure 7C:
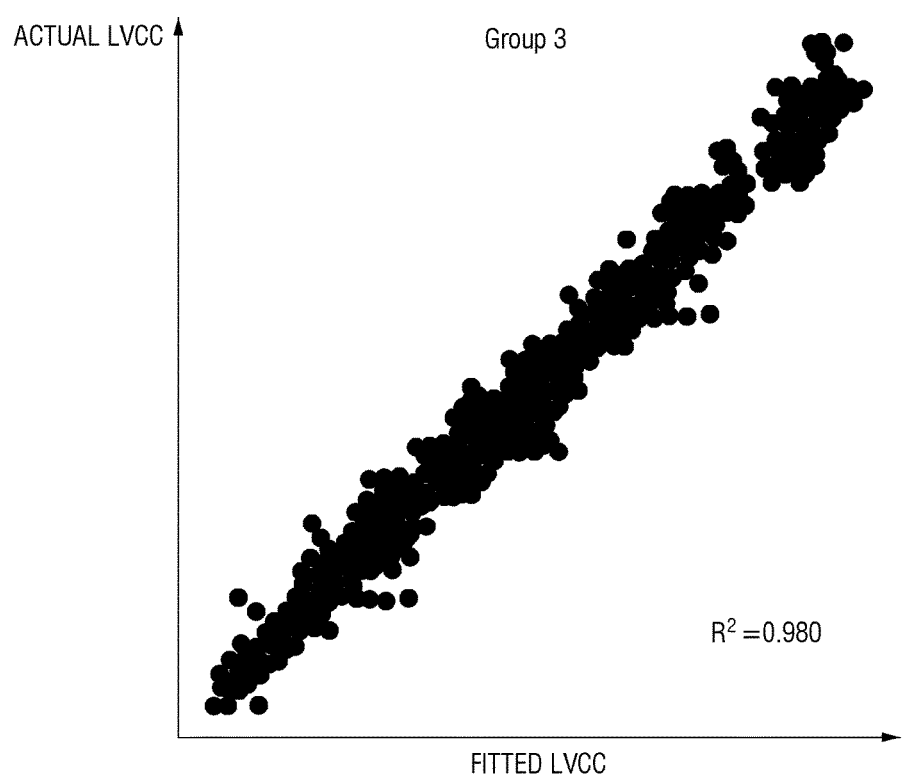

FIG. 6 is a graph illustrating results obtained by performing a method of testing a semiconductor device according to an exemplary embodiment of the present disclosure. FIGS. 7A to 7C are graphs illustrating divided parts of the graph shown in FIG. 6, respectively.

First, referring to FIG. 6, after completion of modeling for multiple semiconductor devices, the model can be verified on the operating frequency of corresponding ring oscillators included in each of the semiconductor devices. As shown in FIG. 6, the horizontal axis of the graph represents fitted values of the minimum operating voltages calculated using operating frequencies of multiple semiconductor devices, and the vertical axis of the graph represents the actual measurements of the minimum operating voltages of the semiconductor devices obtained by the above-described measurement.

Illustratively, the coefficient of determination $R^2$ of the model generated through the above procedure is represented by 0.937.

In the method of testing a semiconductor device according to some embodiments of the present disclosure, modeling may be performed by dividing multiple semiconductor devices to be measured into at least two groups.

Specifically, among the populations of the semiconductor devices to be measured, there may be a group that affects the fitted value of the minimum operating voltage and the linearity of the actually measured minimum operating voltage. When models for the groups are separately generated, the linearity or the coefficient of determination of one or each of the groups may increase.

In some embodiments of the present disclosure, the semiconductor devices may be divided into groups by the operating frequency of the semiconductor devices.

As described above, during the process of measuring the minimum operating voltage of the semiconductor device 100, the first minimum operating voltage for the first operating frequency and the second minimum operating voltage for the second operating frequency of the semiconductor device 100 may be measured. FIG. 6 may be the graph showing the fitted value as well as actually measured value of the minimum operating voltage of the semiconductor device 100 necessary for operating at different frequencies.

In an individual semiconductor device 100, the minimum operating voltage generally increases with the operating frequency. Therefore, when the graph of FIG. 6 is divided into three groups Group1, Group2 and Group3 by the minimum operating voltage, it may be similar to the result of dividing by the operating frequency of the semiconductor devices 100.

FIGS. 7A to 7C are graphs showing the relationships between fitted value and actually measured value of the minimum operating voltage of the semiconductor devices 100 divided into three groups Group1, Group2 and Group3, respectively, by the operation frequency.

Referring to FIG. 7A, the graph shows the relationship between the fitted value calculated using the operating frequencies of the ring oscillators in the semiconductor devices 100 and the regression model and the actually measured minimum operating voltages when the semiconductor devices 100 operate within the frequency range of Group1. As a reminder, the frequency range of Group1 is the lowest operating frequency among the three groups Group 1, Group 2 and Group 3.

It can be seen from FIG. 7A that the calculated coefficient of determination $R^2$ after the grouping is 0.958, which has been increased compared to the coefficient of determination before the grouping, i.e., 0.937. In some embodiments of the present disclosure, modeling representing the relationship between the minimum operating voltages LVCC of the semiconductor devices and the operating frequencies of the ring oscillators therein may be modified using data belonging to the first group Group1. In another embodiment of the present disclosure, a first model representing the relationship between the minimum operating voltages of the semiconductor devices belonging to the first group Group1 and the operating frequencies of the ring oscillators may be separately generated.

Referring to FIG. 7B, the graph shows the relationship between the fitted value calculated using the operating frequencies of the ring oscillators in the semiconductor devices 100 and the regression model and the actually measured minimum operating voltages when the semiconductor devices 100 operate within the frequency range of Group2. As a reminder, the frequency range of Group2 is the second lowest operating frequency among the three groups Group 1, Group 2 and Group 3.

It can be seen from FIG. 7B that the calculated coefficient of determination $R^2$ after the grouping is 0.970, which has been increased compared to the coefficient of determination before the grouping, i.e., 0.980. In some embodiments of the present disclosure, modeling representing the relationship between the minimum operating voltages LVCC of the semiconductor devices and the operating frequencies of the ring oscillators therein may be modified using data belonging to the second group Group2. In yet another embodiment of the present disclosure, a second model representing the relationship between the minimum operating voltages of the semiconductor devices belonging to the second group Group2 and the operating frequencies of the ring oscillators may be separately generated.

Referring to FIG. 7C, the graph shows the relationship between the fitted value calculated using the operating frequencies of the ring oscillators in the semiconductor devices 100 and the regression model and the actually measured minimum operating voltages when the semiconductor devices 100 operate within the frequency range of Group3. As a reminder, the frequency range of Group3 is the third lowest operating frequency among the three groups Group 1, Group 2 and Group 3.

It can also be seen from FIG. 7C that the calculated coefficient of determination $R^2$ after the grouping is 0.980, which has been increased compared to the coefficient of determination before the grouping, i.e., 0.937. In some embodiments of the present disclosure, modeling representing the relationship between the minimum operating voltages LVCC of the semiconductor devices and the operating frequencies of the ring oscillators therein may be modified using data belonging to the third group Group3. In yet another embodiment of the present disclosure, a third model representing the relationship between the minimum operating voltages of the semiconductor devices belonging to the third group Group3 and the operating frequencies of the ring oscillators may be separately generated.

Through the above-described processes, a regression model showing the relationship between the minimum operating voltages of the semiconductor devices 100 and the operating frequencies of the ring oscillators therein can be completed.

Referring again to FIG. 3, the operating frequency of the ring oscillators ROs included in the target semiconductor chip is measured (S120).

The target semiconductor may be of the same kind as the semiconductor devices whose minimum operating voltage and the ring oscillators have been measured to generate the above-described model. Therefore, the minimum operating voltage of the target semiconductor is predicted using the above model.

The operating frequency of the ring oscillators ROs included in the target semiconductor may be measured using the measuring equipment 200 of FIG. 4 described above. Therefore, the measuring equipment 200 may input a test signal to and receive a test response signal from the terminals of the exposed ring oscillators ROs before sawing and packaging of the target semiconductor device is performed.

In the above-described process of generating the model using the semiconductor, the minimum operating voltage of the first functional block 110 included in the semiconductor device 100 and the operating frequency of the ring oscillators included therein were used. Accordingly, the operating frequency of the ring oscillators ROs of the first functional block 110 in the semiconductor device 100 that is the target may also be measured.

Subsequently, by using the measured operation frequency of the ring oscillators in the target semiconductor device and the model, the target minimum operating voltage of the target semiconductor device is determined (S140).

The target minimum operating voltage may be obtained by substituting the measured operating frequency of the ring oscillators ROs into the model generated through the above-described processes, to calculate a predicted value of the minimum operating voltage. In some embodiments of the present disclosure, the target minimum operating voltage may be the target minimum operating voltage of the first functional block 110.

Subsequently, the actual minimum operating voltage of the target semiconductor device is determined using the target minimum operating voltage of the target semiconductor device (S140).

In some embodiments of the present disclosure, the actual minimum operating voltage of the target semiconductor device may be determined by applying the determined target minimum operating voltage to the target semiconductor device to check if the target semiconductor device normally operates.

To determine the actual minimum operating voltage of the target semiconductor device, an input voltage is applied to the target semiconductor using the measuring equipment 200. The input voltage may be determined by a trial & error method, i.e., by setting multiple input voltages within a certain input voltage range and applying the input voltages sequentially to check if the target semiconductor device normally operates. In doing so, the test time may vary depending on the initial range of input voltage.

The method of testing a semiconductor device according to the embodiment of the present disclosure uses a model generated by using the minimum operating voltage of each of multiple semiconductor devices and the operating frequency of ring oscillators included in the semiconductor devices. That is, by using the model and the operating frequency of the ring oscillators in a target semiconductor device, the target minimum operating voltage of the target semiconductor device is set. The initial range of input voltage for checking if the target semiconductor device normally operates is set depending on the target minimum operating voltage.

Since the model generated using the semiconductor devices is used, the target minimum operating voltage can be set as close as possible to the actual minimum operating voltage of the target semiconductor device. Therefore, the method of testing a semiconductor device according to the embodiment of the present disclosure can reduce the test time taken by repeating processes of checking whether the target semiconductor device is operating normally.

Figure 8:
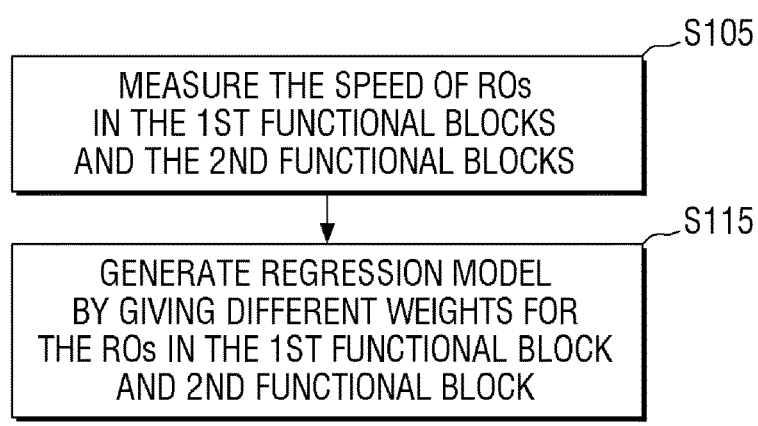
FIG. 8 is a flowchart illustrating a method of testing a semiconductor device according to another exemplary embodiment of the present disclosure.
Figure 9:
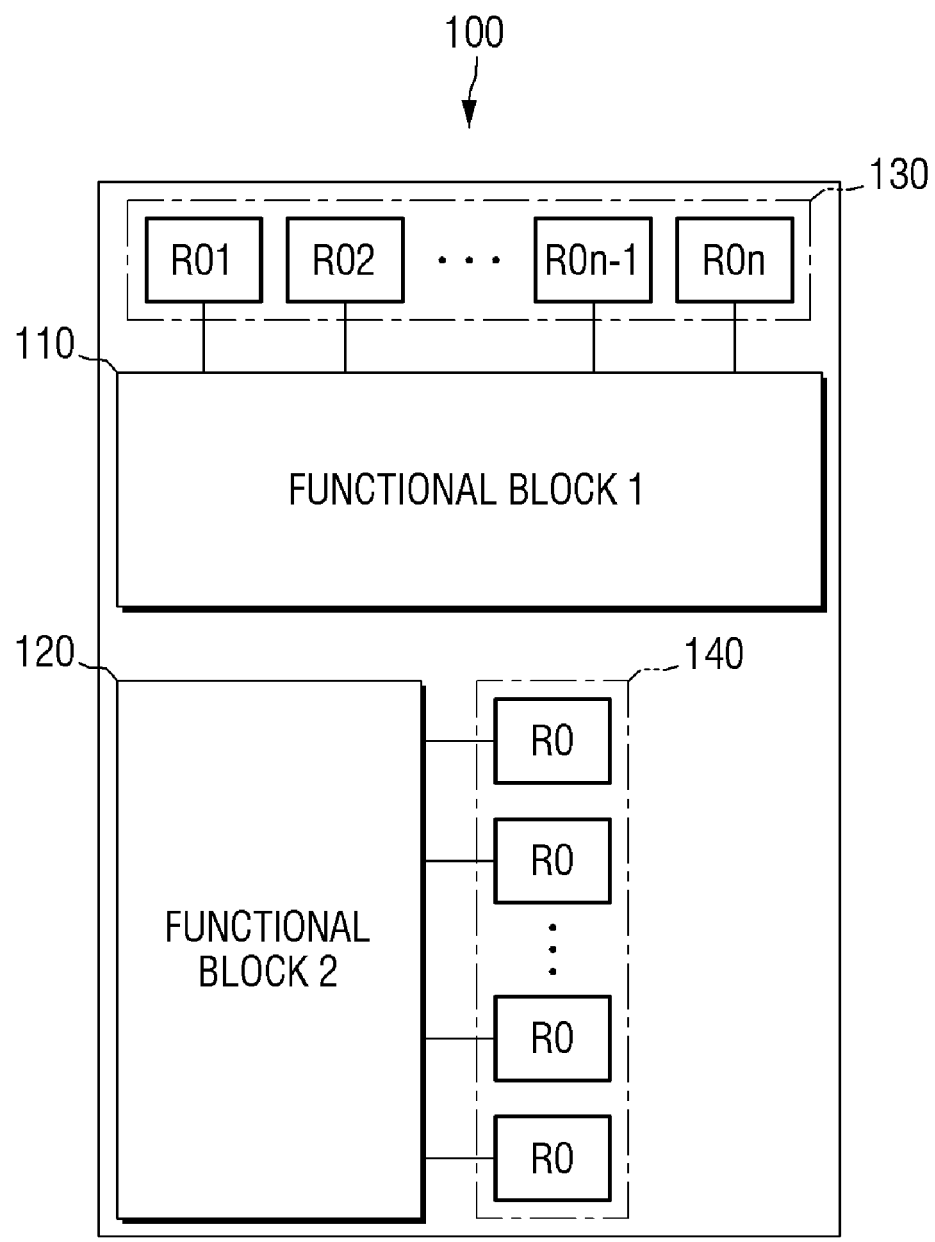
FIG. 9 is a block diagram illustrating a semiconductor device to which a method of testing a semiconductor device according to another exemplary embodiment of the present disclosure may be applied.

FIG. 8 is a flowchart illustrating a method of testing a semiconductor device according to another exemplary embodiment of the present disclosure. FIG. 9 is a block diagram illustrating a semiconductor device to which a method of testing a semiconductor device according to another exemplary embodiment of the present disclosure may be applied.

Referring to FIG. 8, a method of testing a semiconductor device according to this exemplary embodiment the present disclosure may include different processes from the above-described embodiment. That is, to generate a model between the minimum operating voltages of the semiconductor devices and the operating frequencies of the ring oscillators, the operating frequencies of the ring oscillators included in both of different first and second functional blocks 110 and 120 may be used. It is to be noted that the technical idea of the present disclosure is not limited to the ring oscillators included in the two functional blocks of the first functional block 110 and the second functional block 120. For example, all of the functional blocks included in the semiconductor devices 100 may also be used.

Referring to FIG. 9, in a semiconductor device 100 to which the method of testing a semiconductor device according to the exemplary embodiment of the present disclosure may be applied, a first group 131 of ring oscillators included in a first functional block 110, and a second group 140 of ring oscillators included in the second functional block 120 are shown.

First, the minimum operating voltage of the first functional block 110 of the semiconductor devices 100 and the operating frequency of the first group of ring oscillators included in the first functional block 110 are determined by the method according to another embodiment of the present disclosure. Subsequently, the minimum operating voltage of the second functional block 120 of the semiconductor devices 100 and the operating frequency of the second group 140 of ring oscillators included in the second functional block 120 are measured. It is to be understood that the minimum operating voltages of the first functional block 110 and the second functional block 120 may be measured simultaneously by the measuring equipment 200. Likewise, the operating frequencies of the first group 131 and the second group 140 may also be measured simultaneously.

Subsequently, by using the measured minimum operating voltages of the first functional block 110 and the second functional block 120 and the operating frequencies of the ring oscillators in the first group 131 and the second group 140, a model representing the correlation is generated.

This may include the following processes: First, a first model is generated that represents the correlation of the minimum operating voltage of the first functional block 110 with the operating frequency of the ring oscillators in the first group 131 and the second group 140. That is, the method according to this exemplary embodiment is different from the method according to the above-described exemplary embodiment in that the former generates a model using the operating frequencies of the ring oscillators included in both of the first and second functional blocks 110 and 102 while the latter uses the ring oscillators included in the first functional block 110 to generate the model of the minimum operating voltage of the first functional block 110.

In some embodiments of the present disclosure, generating the first model associated with the minimum operating voltage of the first functional block 110 may include applying different weights to the operating frequency of the ring oscillators of the first group 131 and the operating frequency of the ring oscillators of the second group 140.

The first functional block 110 and the second functional block 120 in the semiconductor device 100 perform different functions and are configured separately from each other. However, the two functional blocks 110 and 120 may be connected to each other via an interface circuit, for example. In addition, the effects on the circuit caused by the circuit elements included in the first functional block 110 may affect the circuit operation of the second functional block 120. Conversely, the effects on the circuit caused by the circuit elements included in the second functional block 120 may affect the circuit operation of the first functional block 110.

In the method of testing a semiconductor device according to another embodiment of the present disclosure, different weights are assigned to the operating frequency of the ring oscillators included in the first group 131 and that of the second group 140 in generating a model between the minimum operating voltage of the first functional block 110 and the operating frequencies of the ring oscillators. In some embodiments of the present disclosure, the weight assigned to the operating frequency of the ring oscillators included in the first group 131 may be greater than the weight assigned to the operating frequency of the ring oscillators included in the second group 140.

This is to reflect the operating frequency of the ring oscillators of the first group 131 has a greater influence on the minimum operating voltage of the first functional block 110 in generating the model.

In the method of testing a semiconductor device according to another embodiment of the present disclosure, different weights are assigned to the operating frequency of the ring oscillators included in the first group 131 and that of the second group 140 in generating a model between the minimum operating voltage of the second functional block 120 and the operating frequencies of the ring oscillators. In some embodiments, the weight assigned to the operating frequency of the ring oscillators included in the first group 131 may be greater than the weight assigned to the operating frequency of the ring oscillators included in the second group 140.

By performing the above-described processes, the first model between the minimum operating voltage of the first functional block 110 and the operating frequencies of the ring oscillators, the second model between the minimum operating voltage of the second functional block 120 and the operating frequencies of the ring oscillators can be generated.

The target minimum operating voltage of the target semiconductor device may be determined by using the first model and the second model. The operating frequency of the ring oscillators of the first group 131 of the first functional block 110 and the operating frequency of the ring oscillators of the second group 140 of the second functional block 120 of the target semiconductor device are measured.

The operating frequency of the ring oscillators of the first group 131 of the first functional block 110 and the operating frequency of the ring oscillators of the second group 140 of the second functional block 120 are provided to the first model and the second model, respectively. Subsequently, the target minimum operating voltages of the first functional block 110 and the second functional block 120 are set, and a test for setting the actual minimum operating voltage of the first functional block 110 and the second functional block 120 may be performed.

Figure 10:
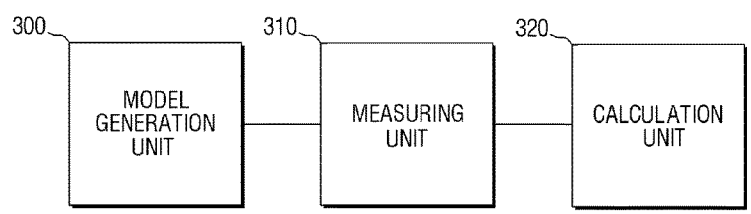
FIG. 10 is a block diagram illustrating a system for testing a semiconductor device according to an exemplary embodiment of the present disclosure.

FIG. 10 is a block diagram illustrating a system for testing a semiconductor device according to an exemplary embodiment of the present disclosure.

Referring to FIG. 10, a system 10 for testing a semiconductor device according to an exemplary embodiment of the present disclosure may include a model generation unit 300, a measuring unit 310, and a calculation unit 320. A model generation unit 300 may be or include a computer or other device with a memory that stores instructions and a processor that executes the instructions. A measuring unit 310 may be or include a metering circuit such as a multimeter or a voltmeter. The calculation unit 320 may be, e.g., a calculator, or may be implemented using calculator software and a computer processor that executes the calculator software.

The measuring unit 310 may measure the minimum operating voltages of multiple semiconductor devices and the operating frequencies of corresponding ring oscillators included in each of the semiconductor devices. The measuring unit 310 may include, but is not limited to, the measuring equipment 200 shown in FIG. 4 to perform measurements on the semiconductor devices.

The model generation unit 300 generates a model between the minimum operating voltages of the semiconductor devices and the operating frequencies of the ring oscillators included in the semiconductor devices, using the measurements of the semiconductor devices provided from the measuring unit 310. The model generation unit 300 may store the generated model, for example, in a memory.

Subsequently, the measuring unit 310 receives a target semiconductor device and measures the operating frequency of the ring oscillators in the semiconductor device. In some embodiments of the present disclosure, the measuring unit 310 may simultaneously measure the operating frequencies of the ring oscillators in the target semiconductor devices included in a single wafer W.

The calculation unit 320 (e.g., calculator or computer processor) may determine the target minimum operating voltage of the target semiconductor device by using the measured operating frequencies of the ring oscillators in the target semiconductor device. In some embodiments of the present disclosure, the calculation unit 320 (e.g., calculator or computer processor) provides the determined target minimum operating voltage again to the measuring unit 310, and the measuring unit 310 uses the target minimum operating voltage to measure the actual minimum operating voltage of the target semiconductor device.

In FIG. 10, the various model generation unit 300, measuring unit 310 and calculation unit 320 may be implemented by a single computer or multiple computers. Similarly, various processes described for embodiments such as S110, S130 and S140 in FIGS. 3 and S115 in FIG. 8 may all be performed by a single computer or multiple computers. A method of testing semiconductor devices can be implemented using a general computer system. Such a computer system can include a set of instructions that is executed to cause the computer system to perform any one or more of the methods or computer based functions disclosed herein. The computer system may operate as a standalone device or may be connected, for example, using a network, to other computer systems or peripheral devices.

In a networked deployment, the computer system may operate in the capacity of a server or as a client user computer in a server-client user network environment, or as a peer computer system in a peer-to-peer (or distributed) network environment. The computer system can also be implemented as or incorporated into various devices, such as a stationary computer, a mobile computer, a personal computer (PC), a laptop computer, a tablet computer, or any other machine capable of executing a set of instructions (sequential or otherwise) that specify actions to be taken by that machine. The computer system can be incorporated as or in a particular device that in turn is in an integrated system that includes additional devices. Further, while a single computer system is illustrated, the term "system" shall also be taken to include any collection of systems or sub-systems that individually or jointly execute a set, or multiple sets, of instructions to perform one or more computer functions.

The computer system may include a processor. A processor for a computer system is tangible and non-transitory. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A processor is an article of manufacture and/or a machine component. A processor for a computer system is configured to execute software instructions in order to perform functions as described in the various embodiments herein. A processor for a computer system may be a general-purpose processor or may be part of an application specific integrated circuit (ASIC). A processor for a computer system may also be a microprocessor, a microcomputer, a processor chip, a controller, a microcontroller, a digital signal processor (DSP), a state machine, or a programmable logic device. A processor for a computer system may also be a logical circuit, including a programmable gate array (PGA) such as a field programmable gate array (FPGA), or another type of circuit that includes discrete gate and/or transistor logic. A processor for a computer system may be a central processing unit (CPU), a graphics processing unit (GPU), or both. Additionally, any processor described herein may include multiple processors, parallel processors, or both. Multiple processors may be included in, or coupled to, a single device or multiple devices.

Moreover, the computer system includes a main memory and a static memory that can communicate with each other via a bus. Memories described herein are tangible storage mediums that can store data and executable instructions, and are non-transitory during the time instructions are stored therein. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A memory described herein is an article of manufacture and/or machine component. Memories described herein are computer-readable mediums from which data and executable instructions can be read by a computer. Memories as described herein may be random access memory (RAM), read only memory (ROM), flash memory, electrically programmable read only memory (EPROM), electrically erasable programmable read-only memory (EEPROM), registers, a hard disk, a removable disk, tape, compact disk read only memory (CD-ROM), digital versatile disk (DVD), floppy disk, blu-ray disk, or any other form of storage medium known in the art. Memories may be volatile or non-volatile, secure and/or encrypted, unsecure and/or unencrypted.

As shown, the computer system may further include a video display unit 150, such as a liquid crystal display (LCD), an organic light emitting diode (OLED), a flat panel display, a solid-state display, or a cathode ray tube (CRT). Additionally, the computer system may include an input device, such as a keyboard/virtual keyboard or touch-sensitive input screen or speech input with speech recognition, and a cursor control device, such as a mouse or touch-sensitive input screen or pad. The computer system can also include a disk drive unit, a signal generation device, such as a speaker or remote control, and a network interface device.

In a particular embodiment, the disk drive unit may include a computer-readable medium in which one or more sets of instructions, e.g. software, can be embedded. Sets of instructions can be read from the computer-readable medium. Further, the instructions, when executed by a processor, can be used to perform one or more of the methods and processes as described herein. In a particular embodiment, the instructions may reside completely, or at least partially, within the main memory, the static memory, and/or within the processor during execution by the computer system.

In an alternative embodiment, dedicated hardware implementations, such as application-specific integrated circuits (ASICs), programmable logic arrays and other hardware components, can be constructed to implement one or more of the methods described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory processor and/or memory.

In accordance with various embodiments of the present disclosure, the methods described herein may be implemented using a hardware computer system that executes software programs. Further, in an exemplary, non-limited embodiment, implementations can include distributed processing, component/object distributed processing, and parallel processing. Virtual computer system processing can be constructed to implement one or more of the methods or functionality as described herein, and a processor described herein may be used to support a virtual processing environment.

The present disclosure contemplates a computer-readable medium that includes instructions or receives and executes instructions responsive to a propagated signal; so that a device connected to a network can communicate data over the network. Further, the instructions may be transmitted or received over the network via the network interface device.

The embodiments of the present disclosure have been described with reference to the attached drawings, but it may be understood by one of ordinary skill in the art that the present disclosure may be performed one of ordinary skill in the art in other specific forms without changing the technical concept or essential features of the present disclosure. Further, the above-described embodiments are merely examples and do not limit the scope of the rights of the present disclosure.

What is claimed is:

1. A method of testing a semiconductor device, the method comprising:
   measuring minimum operating voltages of each of a plurality of sample semiconductor devices and operating frequencies of corresponding ring oscillators included in each of the plurality of sample semiconductor devices;
   generating a model between the operating frequencies of the ring oscillators and the minimum operating voltages of each of the corresponding plurality of sample semiconductor devices;
   measuring an operating frequency of ring oscillators included in a target semiconductor device; and
   determining a target minimum operating voltage of the target semiconductor device based on the operating frequency of the ring oscillators of the target semiconductor device and the model.

2. The method of claim 1, wherein the ring oscillators comprise different ring oscillators in the sample semiconductor devices, and
   wherein generating the model comprises generating a regression model between the operating frequencies of the different ring oscillators and the minimum operating voltages of each of the corresponding plurality of sample semiconductor devices.

3. The method of claim 2, wherein each of the sample semiconductor devices comprises a first functional block and a second functional block different from each other, and
   wherein generating the model comprises:
   generating a first model between the operating frequencies of the ring oscillators and a minimum operating voltage of the first functional block of each of the sample semiconductor devices; and
   generating a second model between the operating frequencies of the ring oscillators and a minimum operating voltage of the second functional block of each of the sample semiconductor devices.

4. The method of claim 3, wherein the ring oscillators include a first group in the first functional block and a second group in the second functional block, and
   wherein the generating the first model comprises:
   generating a regression model between the minimum operating voltage of the first functional block and the operating frequencies of the ring oscillators included in the first group and the second group.

5. The method of claim 4, wherein the first model comprises different weights assigned to the operating frequencies of the first group and the second group.

6. The method of claim 4, wherein the minimum operating voltage of the first functional block is different from the minimum operating voltage of the second functional block.

7. The method of claim 2, wherein the generating the regression model comprises using the operating frequencies of the sample semiconductor devices.

8. The method of claim 1, further comprising:
   determining an actual minimum operating voltage of the target semiconductor device by using the target minimum operating voltage of the target semiconductor device.

9. The method of claim 8, wherein the determining the actual minimum operating voltage comprises applying the target minimum operating voltage as an input supply voltage to the target semiconductor device.

10. The method of claim 1, wherein the generating the model comprises:
    sorting the ring oscillators into first and second groups by the operating frequency of the ring oscillators;
    generating a first model between an operating frequency of the first group and the minimum operating voltage of the sample semiconductor devices; and
    generating a second model between an operating frequency of the second group and the minimum operating voltage of the sample semiconductor devices.

11. The method of claim 10, further comprising:
    determining an actual minimum operating voltage by applying the target minimum operating voltage as an input supply voltage to the target semiconductor device.

12. A system for testing a semiconductor device, the system comprising:
    a measuring unit configured to measure minimum operating voltages of each of a plurality of sample semiconductor devices and operating frequencies of corresponding ring oscillators included in the plurality of sample semiconductor devices;
    a model generation unit configured to generate a model between the operating frequencies of the ring oscillators and the minimum operating voltages of the corresponding sample semiconductor devices; and
    a calculator configured to determine a target minimum operating voltage of a target semiconductor device from the model by using an operating voltage of a target semiconductor device provided from the measuring unit and the operating frequency of the ring oscillators included in the target semiconductor device.

13. The system of claim 12, wherein the ring oscillators comprise different ring oscillators in the sample semiconductor devices, and
    wherein the model generation unit generates a regression model between the operating frequencies of the different ring oscillators and the minimum operating voltages of the sample semiconductor devices.

14. The system of claim 13, wherein the model generation unit generates the model between the operating frequencies of the ring oscillators and the minimum operating voltages of each of the sample semiconductor devices by using the operating frequency of each of the sample semiconductor devices.

15. The system of claim 12, wherein the calculator provides the determined target minimum operating voltage to the measuring unit, and
    wherein the measuring unit measures an actual minimum operating voltage of the target semiconductor device by using the target minimum operating voltage.

16. A method of testing a semiconductor device, comprising:
- measuring minimum operating voltages of each of a plurality of sample semiconductor devices;
- measuring operating frequencies of corresponding ring oscillators included in each of the plurality of sample semiconductor devices;
- generating a model correlating the measured operating frequencies of the ring oscillators and the measured minimum operating voltages of the corresponding plurality of sample semiconductor devices;
- measuring an operating frequency of ring oscillators included in a target semiconductor device;
- determining, based on the model, a target minimum operating voltage of the target semiconductor device based on the measured operating frequency of the ring oscillators in the target semiconductor device; and
- setting the determined target minimum operating voltage of the target semiconductor device as the minimum operating voltage of the target semiconductor device.

17. The method of claim 16,
wherein generating the model comprises generating a regression model correlating the measured operating frequencies of the ring oscillators and the measured minimum operating voltages of the corresponding plurality of sample semiconductor devices.

18. The method of claim 16,
wherein the determining the minimum operating voltage comprises applying the target minimum operating voltage as an input supply voltage to the target semiconductor device.

19. The method of claim 16, wherein the generating the model comprises:
- sorting the ring oscillators into first and second groups by the operating frequency of the ring oscillators;
- generating a first model correlating operating frequencies of the first group and minimum operating voltages of the sample semiconductor devices; and
- generating a second model correlating operating frequencies of the second group and the minimum operating voltages of the sample semiconductor devices.

20. The method of claim 19, further comprising:
- determining an actual minimum operating voltage by applying the target minimum operating voltage as an input supply voltage to the target semiconductor device.

* * * * *